United States Patent [19]
Jang

[11] Patent Number: 5,525,833
[45] Date of Patent: Jun. 11, 1996

[54] PROCESS FOR MAKING A BIPOLAR JUNCTION TRANSISTOR WITH A SELF-ALIGNED BASE CONTACT

[75] Inventor: Wen-Yuen Jang, Hsin-chu, Taiwan

[73] Assignee: Winbond Electronics Corporation, Hsinchu, Taiwan

[21] Appl. No.: 476,313

[22] Filed: Jun. 7, 1995

Related U.S. Application Data

[62] Division of Ser. No. 274,540, Jul. 13, 1994.

[51] Int. Cl.⁶ .................................................. H01L 27/082
[52] U.S. Cl. .......................... 257/587; 257/588; 257/592
[58] Field of Search ................................ 257/587, 588, 257/592, 773

[56] References Cited

U.S. PATENT DOCUMENTS

| | | | |
|---|---|---|---|
| 4,752,591 | 6/1988 | Beitman | 257/588 |
| 5,006,416 | 4/1991 | De Jong et al. | 437/162 |
| 5,006,476 | 4/1991 | De Jong et al. | 437/31 |
| 5,059,549 | 10/1991 | Furuhata | 437/162 |
| 5,187,109 | 2/1993 | Cook et al. | 437/162 |
| 5,194,926 | 3/1993 | Hayden | 437/31 |
| 5,268,314 | 12/1993 | Conner | 437/31 |
| 5,328,862 | 7/1994 | Goo | 437/41 |
| 5,358,879 | 10/1994 | Brady et al. | 437/44 |

FOREIGN PATENT DOCUMENTS

| | | | |
|---|---|---|---|
| 3-74848 | 3/1991 | Japan | 437/44 |
| 029330 | 2/1993 | Japan | 437/69 |
| 5-129325 | 5/1993 | Japan | 257/344 |
| 5-267331 | 10/1993 | Japan | 437/44 |

OTHER PUBLICATIONS

Hori et al., "A Self–Aligned Pocket Implantation (SPI) Technology for 0.2 micron Dual–Gate CMOS", IEEE Electron Device Letters, vol. 13, No. 4, Apr. 1992, pp. 174–176.

"Simplified Lightly Doped Drain Process", IBM Technical Disclosure Bulletin, vol. 30, No. 12, May 1988, pp. 180–181.

*Primary Examiner*—Mark V. Prenty
*Attorney, Agent, or Firm*—Meltzer, Lippe, Goldstein, et al.

[57] ABSTRACT

In accordance with the invention, the emitter region of a BJT is formed prior to the formation of the base contact regions so that the base contact regions are not enlarged during a thermal cycle used to form the emitter and the base contact regions remain small. Preferably, the base contact regions are formed by ion implantation after the emitter is formed. In addition, the base interconnect links may be metal (or polycide) rather than polysilicon so that the base interconnect resistance is reduced.

This results in the following advantages:
(1) reduced emitter-base junction leakage
(2) reduced collector-base junction capacitance.
(3) reduced base interconnection series resistance.

5 Claims, 4 Drawing Sheets

PROCESS FOR MAKING A BIPOLAR JUNCTION TRANSISTOR WITH A SELF-ALIGNED BASE CONTACT

This is a division of application Ser. No. 08/274,540, filed Jul. 13, 1994 for A PROCESSING FOR MAKING A BIPOLAR JUNCTION TRANSISTOR WITH A SELF-ALIGNED BASE CONTACT.

FIELD OF THE INVENTION

The present invention relates to a process for making a bipolar junction transistor with a self-aligned base contact.

BACKGROUND OF THE INVENTION

FIG. 1 illustrates a conventional bipolar junction transistor 10. The device is formed on a silicon substrate which is illustratively P$^-$ type. A buried N$^+$ layer 14 is located on the substrate 12. An N-type collector region 16 is located on the buried N$^+$ layer 14. A plurality of field oxide (FOX) regions 18 are formed on the substrate. An N$^+$ deep connection region 20 connects the substrate surface to the buried N$^+$ layer 14 to form a collector contact for contacting the collector 16. A P-type base region 22 is formed in the N-type well 16, which well forms the collector. Two P$^+$-type base contact regions 24 and 26 are formed on either side of the base 22. The emitter 28 includes the N$^+$ polysilicon or polycide region 30 formed on the surface of the substrate. The emitter 28 also includes the N$^+$ region 29. Spacers such as oxide spacers 32 and 34 are located on either side of the polysilicon region 30. Two metal contacts 36 and 38 connect to the P$^+$ base contact regions 24 and 26. A third metal contact 40 connects to the deep connector region 20 for contact with the N$^+$ collector contact layer 14. The metal contacts 36, 38 and 40 are formed in openings of a metal-poly-dielectric (MPD) layer 42.

The overall structure is an NPN transistor with N-type collector 16, P-type base 22 and N-type emitter 28. The buried N$^+$ layer 14 and N$^+$ deep connector 20 form a collector contact. The P$^+$ regions 24 and 26 form a base contact.

It should be noted that in the conventional bipolar junction transistor (BJT) shown in FIG. 1, the P$^+$ base contact regions 24 and 26 are large (e.g. a depth of 0.3 µm and a width of 1.4 µm). Hence, there is a large base to collector capacitance that degrades BJT performance greatly. (The base contact regions 24 and 26 are large because it is necessary to account for base contact to emitter and base contact to FOX edge misalignment.)

To improve the BJT characteristics the BJT is formed using a process so that the base contact is self-aligned. A BJT 10' with a self-aligned base contact is illustrated in FIG. 2 and is formed as follows. Using conventional front end processes, the N$^+$ layer 14 is formed on the substrate 12. The N-type collector region 16 is formed and then the field oxide (FOX) regions 18 are formed on the substrate surface. The deep collector connector region 20 is then formed by diffusion or ion implantations into the N-well 16. Next, the P base region 22 is formed by diffusion or ion implantation. Next the P$^+$ polysilicon interconnect links 54 and 56 are formed. The interconnect links 54 and 56 are formed by depositing a polysilicon layer, patterning the polysilicon layer using photolithography and then etching. The P$^+$ base contact regions 24 and 26 are formed by out-diffusion from the P$^+$ polysilicon interconnect links 54 and 56. This forms a self-aligned link from the P base 22, through the P$^+$ base contact regions 24 and 26, and through the P$^+$ polysilicon regions 54 and 56 to the base metal contacts 36 and 38 (which are formed after MPD deposition).

Next the inter emitter base isolation oxide regions 64 and 66 are formed by depositing an oxide layer and patterning the oxide layer. Then the emitter 28 is formed by depositing a N$^+$ polysilicon layer and patterning this layer to form the N$^+$ polysilicon emitter region 30. The N$^+$ emitter region 29 is formed by out-diffusion from the N$^+$ polysilicon region 30. After this, the MPD layer 42 is formed and patterned to enable formation of the metal contacts 36, 38 and 40.

From these steps the BJT 10' with the self aligned base contact is formed. Because the P base 22 is connected using the P$^+$ polysilicon regions 54 and 56, the P$^+$ base contact regions 24 and 26 can be made smaller than in the conventional device of FIG. 1. Thus, the collector-base capacitance in the device 10' of FIG. 2 is smaller than in the device 10 of FIG. 1.

However, the device 10' of FIG. 2 still has certain deficiencies. First of all, the P$^+$ base contact regions 24 and 26 are formed before a thermal cycle is used to form the N$^+$ emitter region 29 by out-diffusion from the N$^+$ polysilicon region 30. This thermal cycle will cause the P$^+$ impurities in the P$^+$ regions 24 and 26 to out-diffuse, thereby enlarging the size of the P$^+$ regions 24 and 26. This in turn can cause N$^+$ emitter region (region 29) to P$^+$ base contact region (regions 24 and 26) junction leakage. In addition, the base to collector capacitance will be increased. Moreover, because the P$^+$ base contact regions 24 and 26 are formed by out-diffusion from the P$^+$ links 54 and 56, only polysilicon or polycide can be used for these links and this results in a large base interconnection resistance.

It is an object of the invention to provide a process for forming BJT with a self aligned base contact which overcomes the problems of the conventional BJT with self-aligned base contact.

SUMMARY OF THE INVENTION

In a preferred embodiment, the present invention is directed to a process for forming a BJT with a self aligned base contact. The emitter region of a BJT is formed prior to the formation of the base contact regions so that the base contact regions are not enlarged during a thermal cycle used to form the emitter. Therefore, the base contact regions remain small. Preferably, the base contacts are formed by ion implantation after the emitter is formed. The base interconnect links may be metal (or polycide) rather than polysilicon as out-diffusion from the base interconnect links is not used to form the base contact regions.

This results in a device with in the following advantages:
(1) reduced emitter-base junction leakage
(2) reduced collector-base junction capacitance.
(3) reduced base interconnection series resistance.

DETAILED DESCRIPTION OF THE INVENTION

As indicated above, the present invention is directed to a method for forming a BJT with a self-aligned base contact.

Figure 3:
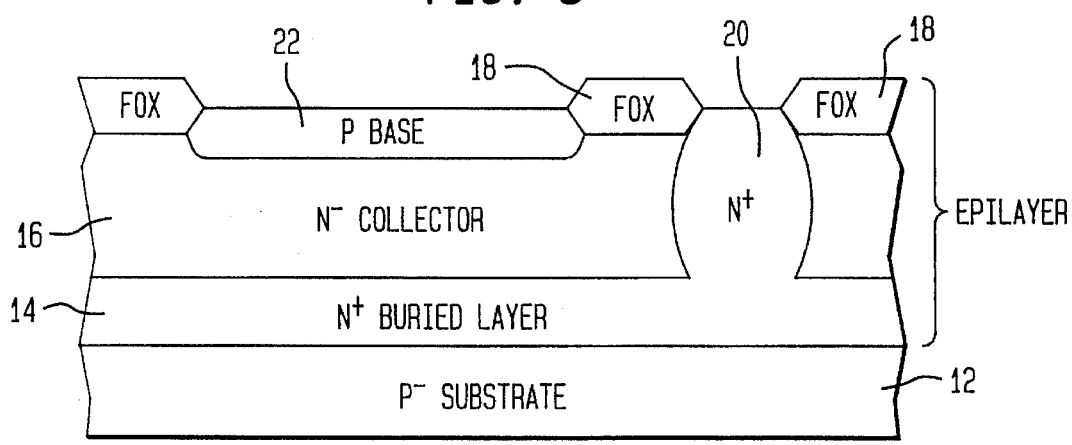
FIGS. 3, 4, 5, 6, 7, 8, 9, 10 and 11 illustrate a process for forming a BJT with a self-aligned base contact according to an illustrative embodiment of the present invention.

The starting point for the inventive method according to an illustrative embodiment is shown in FIG. 3. The silicon substrate 12 is a P⁻ substrate with a dopant concentration of about $10^{15}$ c⁻³. A N⁺ buried layer 14 is formed in the substrate 12. The N⁺ buried layer has a thickness of about 2 μm and a dopant concentration of $10^{20}$ cm⁻³. Next, an N-type layer 16 is formed. The N-type layer 16 forms the collector of the BJT. The N-type layer 16 has a dopant concentration of about $6\times10^{16}$ cm⁻³ and a thickness of about 0.8 μm. Next, a plurality of FOX regions 18 are formed on the surface of the substrate by depositing and patterning an oxide layer. The FOX regions have a thickness of about 5000 Å. Then, using diffusion or ion implantation, the N⁺ deep collector connection 20 is formed and the P base region 22 is formed. The base region 22 is relatively lightly doped. The deep collector connection 20 has a depth of 1 μm, and a dopant concentration of $10^{20}$ cm⁻³. The base region 22 has a depth of 0.3 μm, and a dopant concentration of $10^{18}$ cm⁻³.

Figure 1:
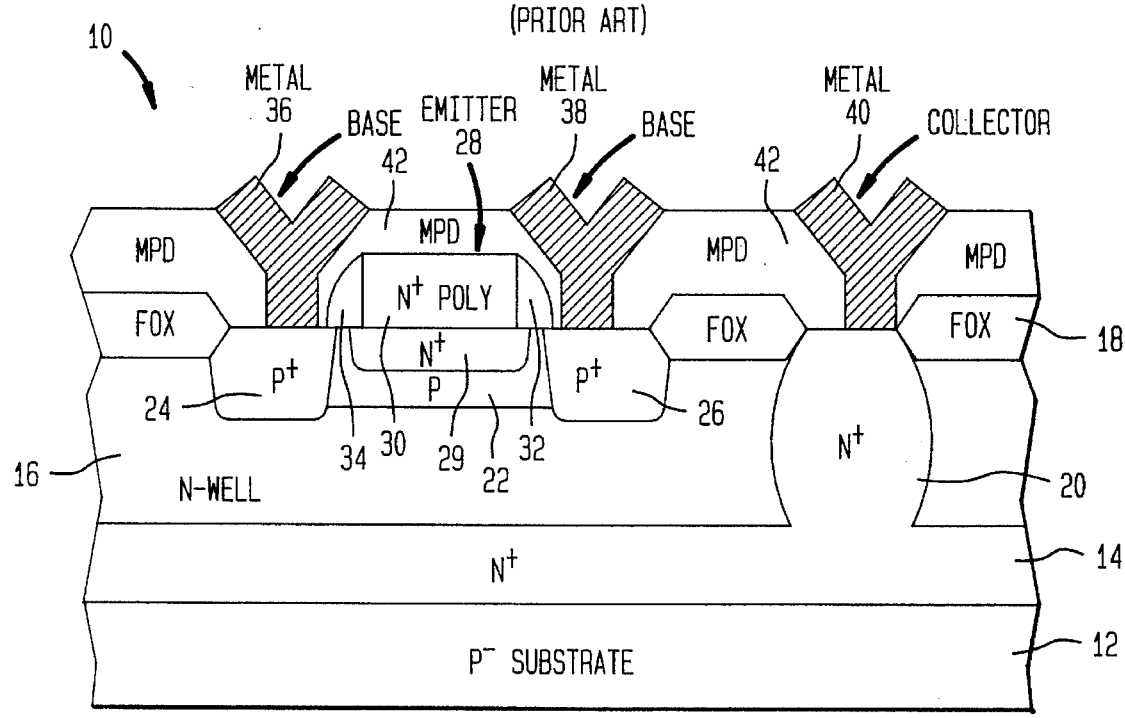
FIG. 1 schematically illustrates a conventional BJT.

It should be noted that the structure of FIG. 3 is entirely conventional. It is the starting point for the fabrication of the prior art devices of FIG. 1 and FIG. 2, as well as the starting point for the BJT fabrication process of the present invention.

In accordance with a preferred embodiment of the invention, the emitter is formed next. The formation of emitter is illustrated in connection with FIGS. 4 and 5.

Figure 4:
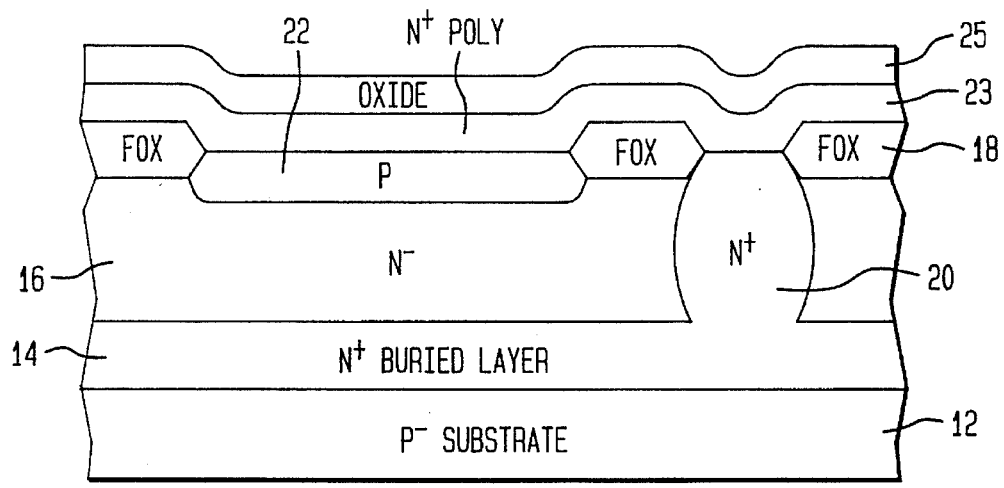

As shown in FIG. 4, an N⁺-type polysilicon (or polycide) layer 23 is deposited on the substrate on top of the FOX region 18, the base region 22, and the deep collector connection 20. The polysilicon layer 23 has a thickness of 3500 Å and a dopant concentration of $10^{20}$ cm⁻³. Then an oxide (SiO₂) layer 25 is deposited on the polysilicon layer 23. The oxide layer 25 has a thickness of 2000 Å.

Figure 5:
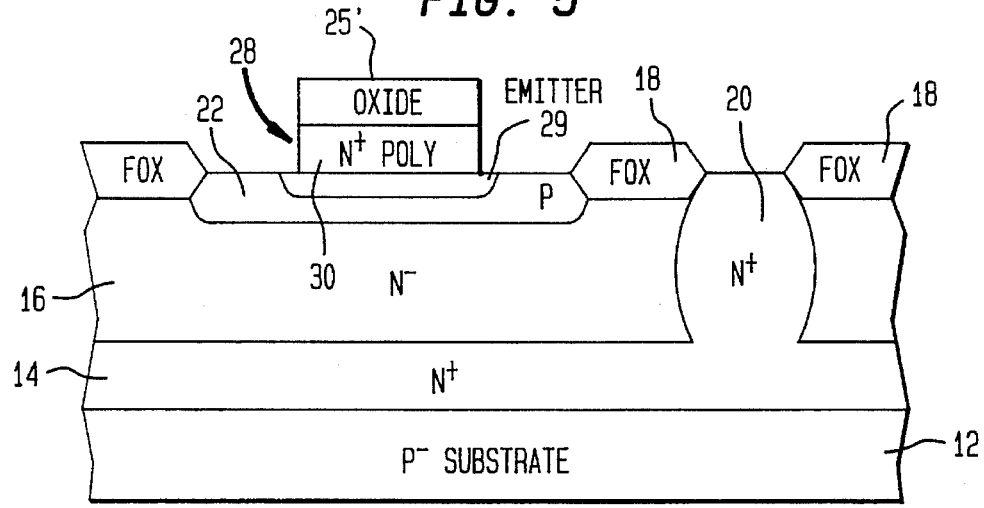

Turning now to FIG. 5, the polysilicon layer 23 and oxide layer 25 are patterned using photolithography and etching for example. The result is the oxide region 25' and the emitter region 30. The emitter region 30 has a width of 0.5 μm. Using a thermal cycle, impurities are out-diffused from the emitter region 30 into the base region 22 to form the N⁺-type emitter region 29. The thermal cycle has a temperature in the range of 900° C. and a time duration in the range of 30 min. The emitter region 29 has a depth of 0.1 μm, a width of 0.6 μm, and a dopant concentration of $10^{20}$ cm⁻³. Thus, the emitter 28 comprises the N⁺-type polysilicon region 30 and the N⁺-type region 29 formed in the substrate.

Figure 6:
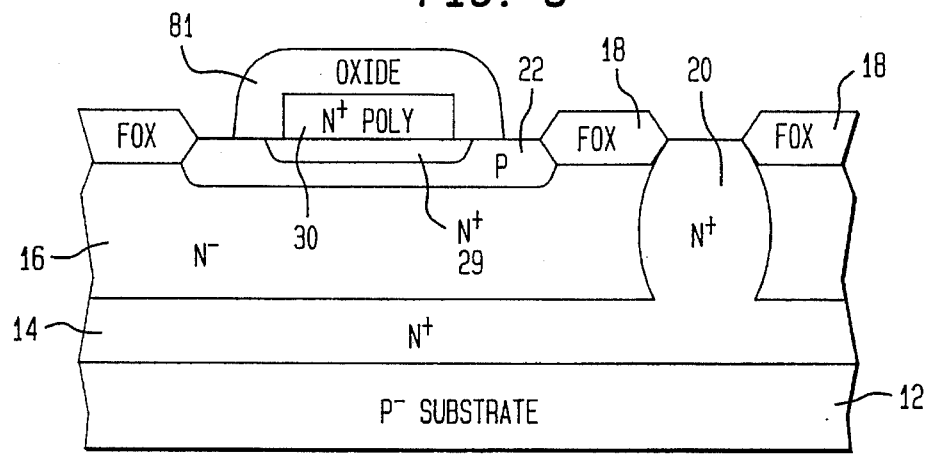
Figure 7:
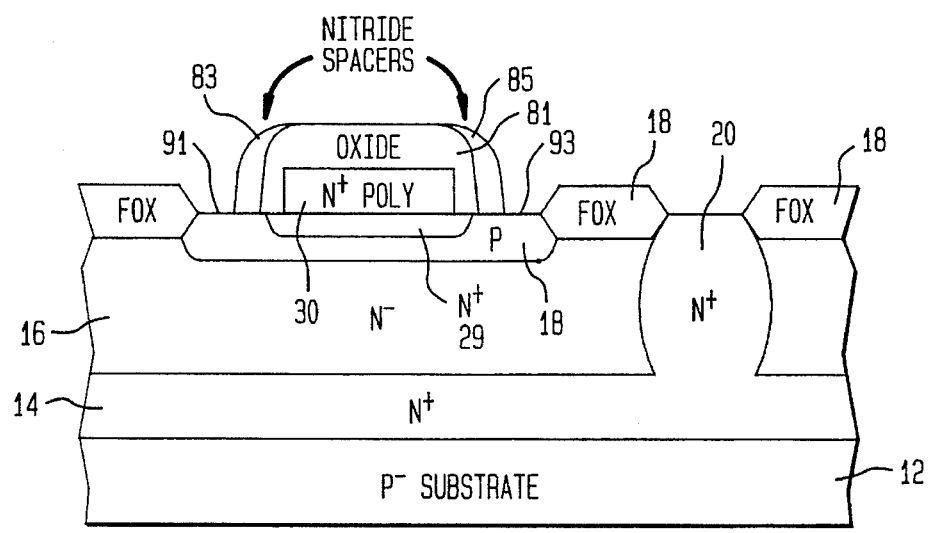

The next steps in the formation of the BJT in accordance with a preferred embodiment of the invention are the formation of oxide spacers and nitride spacers on the sides of the emitter structure. FIG. 6 shows the oxide (SiO₂) spacer structure 81. The oxide spacer structure 81 is formed by depositing an oxide layer of a thickness of 2000 Å and then anisotropically etching the oxide layer. FIG. 7 shows the nitride spacers 83 and 85 which are formed on the sides of the oxide spacer structure 81. The nitride spacers are formed by depositing a nitride (Si₃N₄) layer and then anisotropically etching the nitride layer. It should be noted that after formation of the nitride spacers, the portions 91 and 93 of the base 22 between the nitride spacers and the adjacent FOX regions 18 remain exposed.

Figure 8:
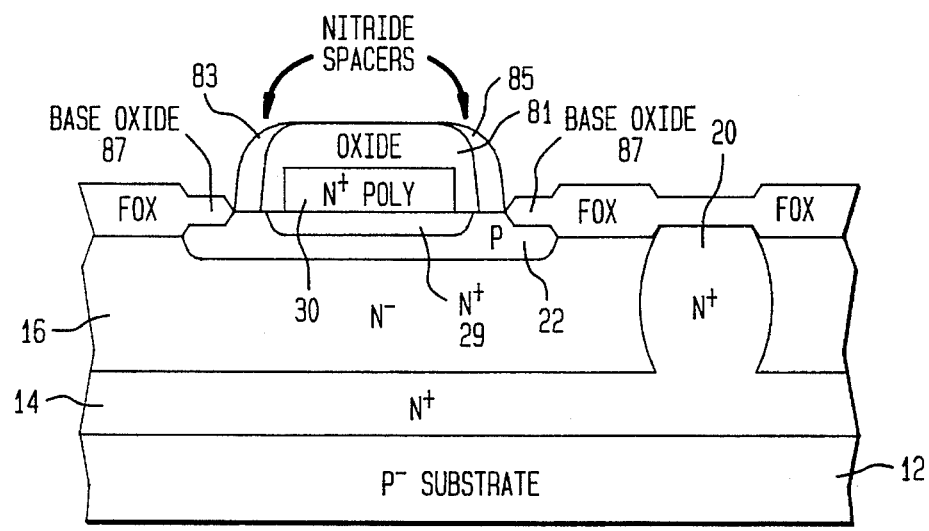

As shown in FIG. 8, the next step is the formation of the base oxide layer 87. The base oxide layer 87 is formed (e.g. by thermal growth) over the deep collector connection and over the exposed regions 91 and 93 (see FIG. 7) of the base 22 between the nitride spacers 83 and 85 and the adjacent FOX regions 18. The base oxide layer 87 has a thickness of 400 Å. Thus, the part of the base near the emitter is covered by the spacer structure 81 and the part of the base remote from the emitter is covered by the oxide layer 87. It should be noted that another dielectric besides oxide may be used for the layer 87.

Figure 9:
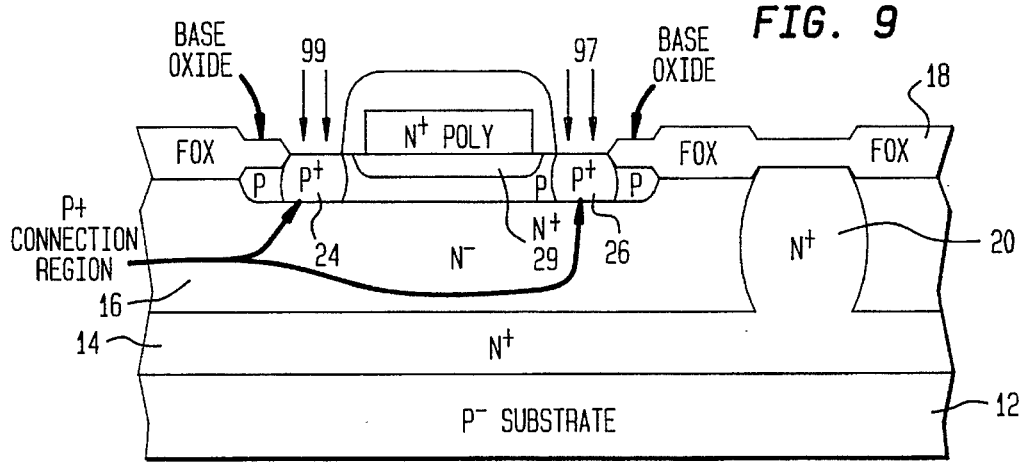

As shown in FIG. 9, the nitride spacers 83 and 85 are then removed for example by etching to form the openings 97 and 99. Then, the P⁺ base contact regions 24 and 26 are formed by ion implantation using boron atoms, for example, with a flux density of $3\times10^{15}$ cm⁻² and an energy of 15 Kev. The base contact regions 24 and 26 are heavily doped compared to the base region 22. The base contact regions have a dopant concentration of $10^{20}$ cm⁻³.

It should be noted that P⁺ base contact regions are formed after the emitter is formed. Thus, there is no thermal cycle which takes place after the formation of the P⁺ base contact regions. Accordingly, there is no substantial out diffusion of impurities from the base contact regions so that the base contact regions remain small. Hence, the N⁺ emitter region 29 to P⁺ base contact region (24 and 26) junction leakage is well controlled and the collector-base capacitance is also small. Specifically, the size of the P⁺ base contact regions 24 and 26 is determined by the width of the nitride spacers (or equivalently the width of the openings 99 and 97). This width is about 0.15 μm. It should be noted that this width is easily controllable and reproducible in production because it is determined by the nitride spacer width.

Figure 10:
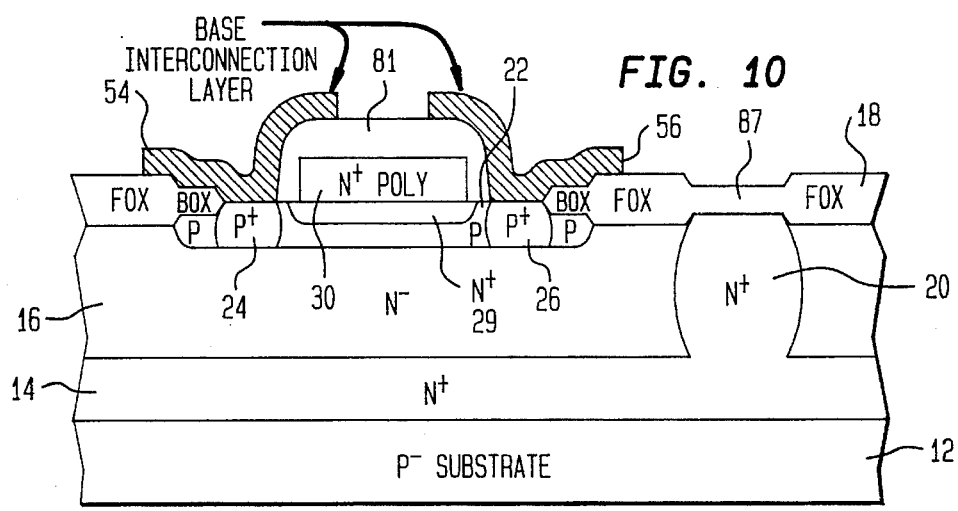

The next step in the formation of the BJT in accordance with the invention is to form the base interconnect links 54 and 56 shown in FIG. 10. The links 54 and 56 are formed by depositing a layer (e.g. with a thickness of 2000 Å) and patterning, the layer to form the links. In the device 10' of FIG. 2, in the links 54 and 56 are polysilicon because the base contact regions are formed by out-diffusion from the links. In contrast, in the inventive device, the interconnect links 54 and 56 may be metal (the preferred material), polycide, or polysilicon because no out-diffusion from these links is utilized. Thus, the base interconnection resistance is substantially reduced, especially when metal, rather than polysilicon, links are used. Note that the base interconnection links 54 and 56 are formed directly over the emitter structure (i.e. over the emitter oxide spacer structure 81).

Figure 11:
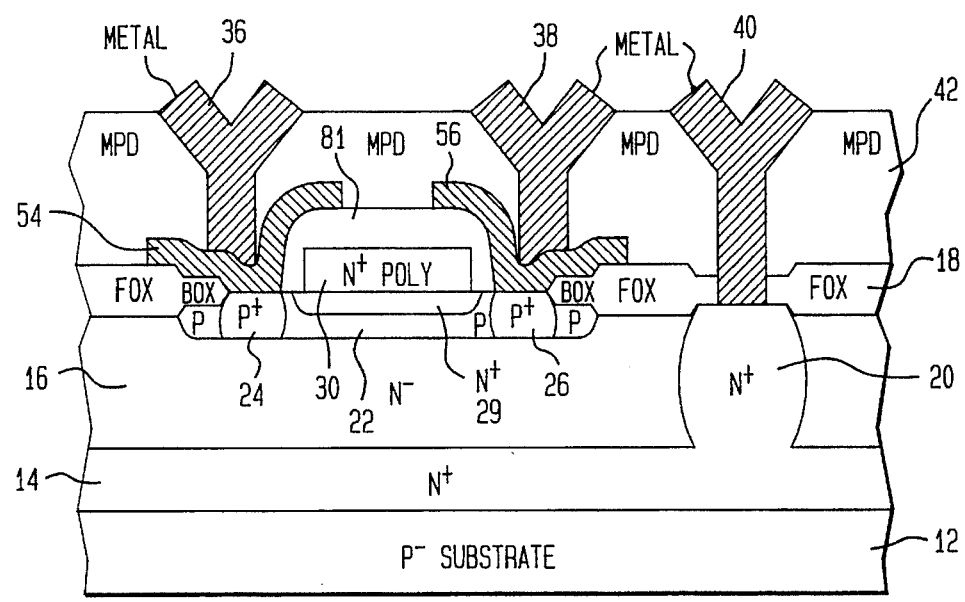

As shown in FIG. 11, the next step in the formation of the BJT device is deposition of the MPD layer 42. The MPD layer 42 has a thickness of 5000 Å. The MPD layer 42 is then patterned to form openings for the base metal contacts 36 and 38 and the collector metal contact 40.

Figure 2:
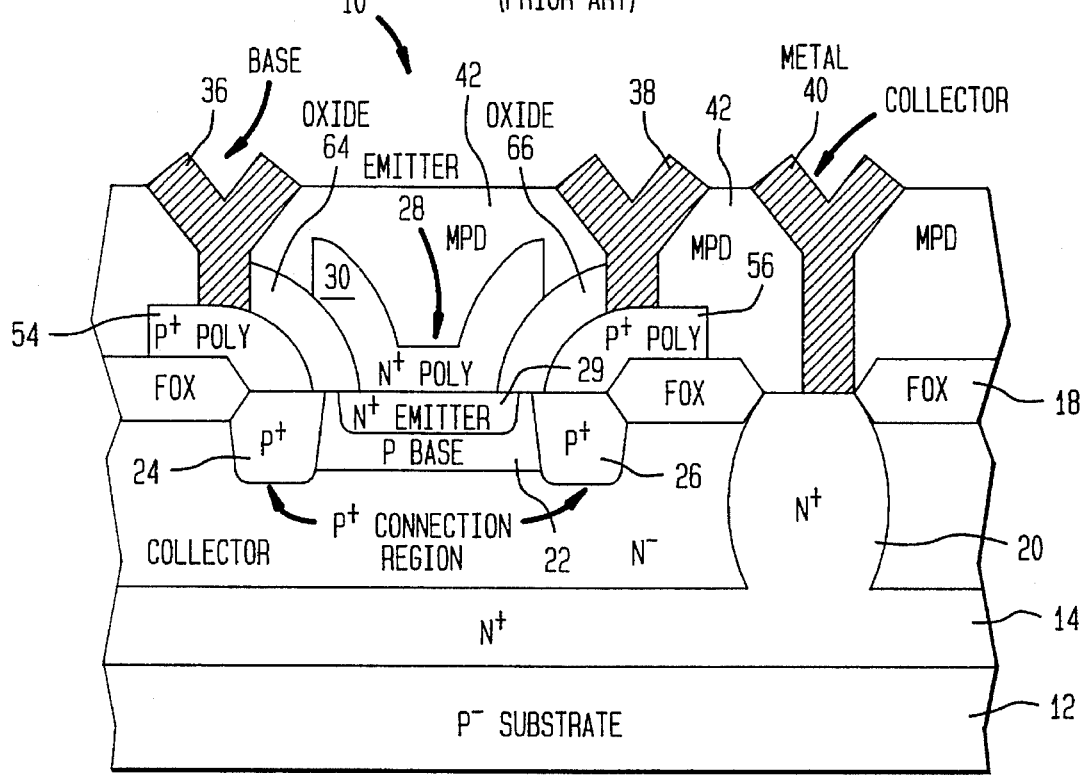
FIG. 2 schematically illustrates a conventional BJT with a self-aligned base contact.

The structure of FIG. 11 has the following advantages in comparison to the prior art device of FIG. 2.

1) reduced emitter-base junction leakage by decreasing out-diffusion from the base contact regions. (Thus, there is a high emitter-base breakdown voltage.)
2) reduced collector-base junction capacitance by reducing the size of the base contact regions,
3) reduced base link series resistance by replacing polysilicon base interconnection links with highly conducting links that are formed from metal or polycide.

Additionally, because the base linkages can be formed over the emitter in accordance with the present invention, the BJT structure formed according to the present invention can be smaller than the prior art devices.

Finally, the above described embodiments of the present invention are intended to be illustrative only. Numerous alternative structures and embodiments may be devised by those skilled in the art without departing from the spirit and scope of the following claims.

I claim:

1. A bipolar junction transistor comprising:

a substrate including a lightly doped base region and a collector region, a thick field oxide region covering a portion of said collector region, an emitter located on the substrate in electrical communication with the base region, a dielectric spacer structure covering said emitter and a portion of said base region located near said emitter, a thin base oxide layer contiguous with said field oxide region and covering a portion of said base region located away from said emitter, wherein said base oxide layer extends toward said dielectric spacer structure so as to leave an opening between said dielectric spacer structure and said base oxide layer, a heavily doped base contact region formed in said base region of said substrate in said opening between said dielectric spacer structure and said dielectric layer, a base interconnect link connecting to said base contact region through said opening and formed in part over said dielectric spacer structure, wherein said base interconnect link covers said opening, said base oxide layer, a portion of said field oxide region and a portion of said dielectric spacer structure so as to increase an area of access to said heavily doped base contact, and a metallic contact which contacts said base interconnect link.

2. The transistor of claim 1 wherein said base interconnect link is metal.

3. The bipolar junction transistor of claim 1, wherein the field oxide region has a thickness of approximately 5000 Å, and the base oxide layer has a thickness of approximately 400 Å.

4. The bipolar junction transistor of claim 1, wherein said heavily doped base contact has a width which approximately equals a width of said opening.

5. The bipolar junction transistor of claim 1, wherein the heavily doped base contact region has a width of approximately 0.15 μm.

* * * * *